United States Patent
DiMarco

(12) 
(10) Patent No.: US 6,654,253 B1
(45) Date of Patent: Nov. 25, 2003

(54) INSERTION EXTRACTION DEVICE HAVING A FLEXIBLE SLEEVE

(75) Inventor: Mario DiMarco, Scottsdale, AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/208,386

(22) Filed: Jul. 29, 2002

(51) Int. Cl.[7] .............................. H05K 5/00; H05K 5/04; H05K 5/06

(52) U.S. Cl. ...................... 361/730; 361/727; 361/728; 361/729; 361/752; 361/753; 361/789; 361/801; 361/803; 361/796; 361/797; 361/825; 361/724; 361/748

(58) Field of Search ................................ 361/752, 800, 361/814, 818, 816, 728, 727, 796, 801, 804, 785, 729, 730, 803, 797, 825, 789, 724, 748

(56) References Cited

U.S. PATENT DOCUMENTS

| | | |
|---|---|---|
| 3,640,141 A | 2/1972 | Hollingsead et al. |
| 4,018,091 A | 4/1977 | Hollingsead et al. |
| 4,497,528 A | 2/1985 | Murtland |
| 4,506,439 A | 3/1985 | Roake |
| 4,534,234 A | 8/1985 | Cosenza |
| 4,577,402 A * | 3/1986 | Swanstrom .................. 29/840 |
| RE32,546 E | 11/1987 | Roake |
| 4,718,632 A | 1/1988 | Meineke |
| 4,804,287 A | 2/1989 | Purdy |
| 4,830,530 A | 5/1989 | Meineke |
| 5,947,509 A * | 9/1999 | Ricks et al. ............. 280/728.2 |
| 2002/0012237 A1 | 1/2002 | DiMarco |

* cited by examiner

Primary Examiner—David Martin
Assistant Examiner—Thanh Yen Tran

(57) ABSTRACT

An insertion extraction device (IED) (100) is suitable for use in attaching a movable object (40) to a fixed structure (20) with a limited amount of force. The IED (100) includes a mandrel (120) and a flexible sleeve (140). The mandrel (120) is constructed of a relatively hard material such as a metal and has a first section (126) with an elliptical, oval, or similar shape and a second section (128) for attaching to the fixed structure (20). The flexible sleeve (140) is constructed of a material such as nylon or urethane plastic. An operator is able to turn the mandrel (120) by turning the sleeve (140) with less than a certain amount of torque. When the operator applies an excessive amount of torque to the sleeve (140), the sleeve (140) slips over the mandrel (120), thereby limiting the maximum amount of force that can be applied to insert the movable component (40) into the fixed structure (20).

20 Claims, 7 Drawing Sheets

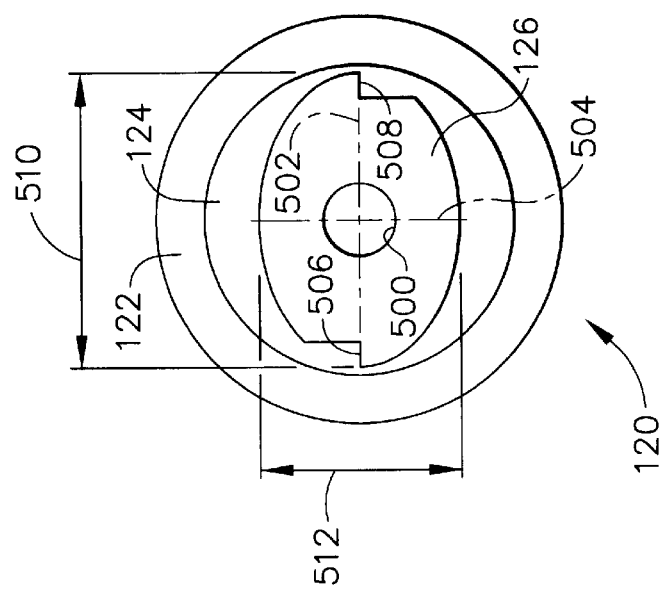
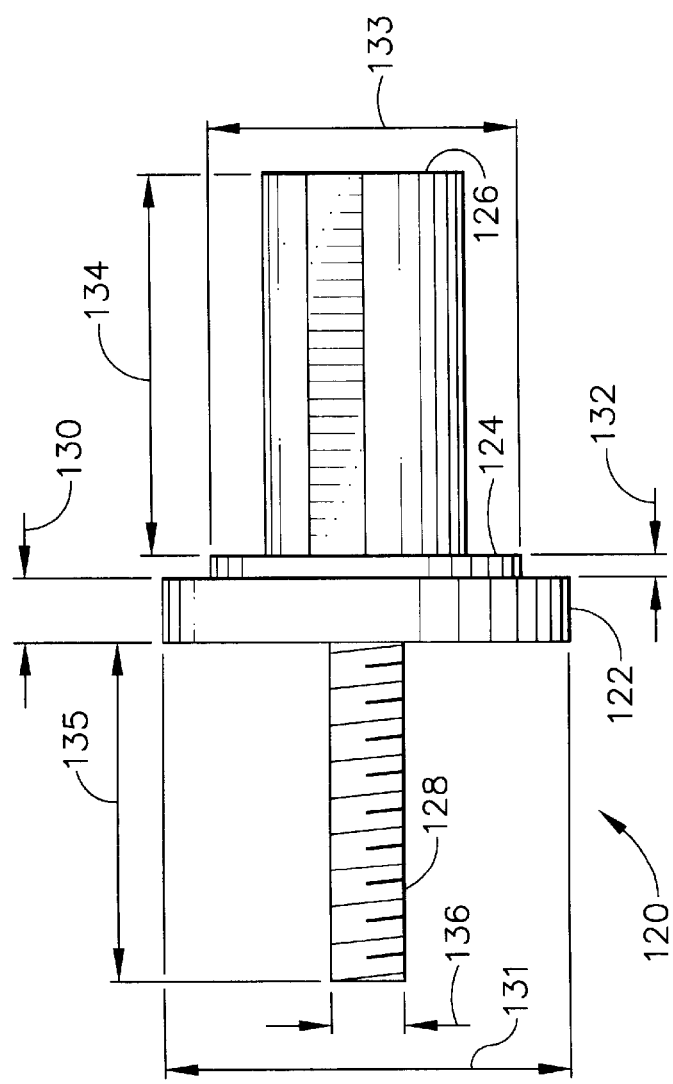
FIG. 5
FIG. 4

INSERTION EXTRACTION DEVICE HAVING A FLEXIBLE SLEEVE

FIELD OF THE INVENTION

This invention relates generally to insertion extraction devices, and more particularly to insertion extraction devices for use in inserting and extracting movable modules to and from fixed structures such as integrated modular avionics cabinets and the like.

BACKGROUND OF THE INVENTION

Airplanes contain various electronic systems such as avionics systems, cabin control systems, energy maintenance systems, flight entertainment systems, and the like. The electronic components are typically disposed on printed circuit board (PCB) modules. These PCB modules have a fixed size and are attached, both electrically and mechanically, to a supporting structure such as, for example, an integrated modular avionics (IMA) cabinet. The PCB modules must be periodically removed for service and re-inserted into the IMA cabinets.

When inserting a PCB module into an IMA cabinet, it is necessary to make proper electrical connections between banks of pins on the PCB module and corresponding sockets attached to the cabinet. In addition the PCB module itself may be delicate. Thus it is necessary to make the connection with an appropriate degree of force. The application of excessive force during insertion can damage or break the pins or sockets, or break the PCB module itself.

An insertion extraction device (IED) is an apparatus that is adapted to mechanically attach the PCB module to the IMA cabinet with a limited amount of force. An IED allows the PCB to be fully seated in the IMA cabinet, providing a mechanical advantage to engage and reseat the PCB. It also keeps the PCB engaged by pre-loading the unit in place. Finally it allows the PCB to be properly disengaged from the IMA cabinet.

There are many known IEDs suitable for use with IMA cabinets. Unfortunately these devices rely on the use of expensive elements including a multitude of washers, ball bearings, and detentes. For certain valuable equipment such as avionics systems the cost of the IED may be acceptable, but for others, such as consumer entertainment systems, the cost is relatively high. What is needed is a lower cost IED which is suitable for the task of inserting and extracting delicate modules to and from fixed structures. Such IED is provided by the present invention, whose features and advantages will be more clearly understood from the following detailed description taken in conjunction with accompanying drawings.

BRIEF DESCRIPTION OF THE DRAWINGS

FIG. 4 illustrates a side view of the mandrel of FIG. 2.

FIG. 5 illustrates a top view of the mandrel of FIG. 2.

DETAILED DESCRIPTION OF THE PREFERRED EMBODIMENTS

Figure 1:
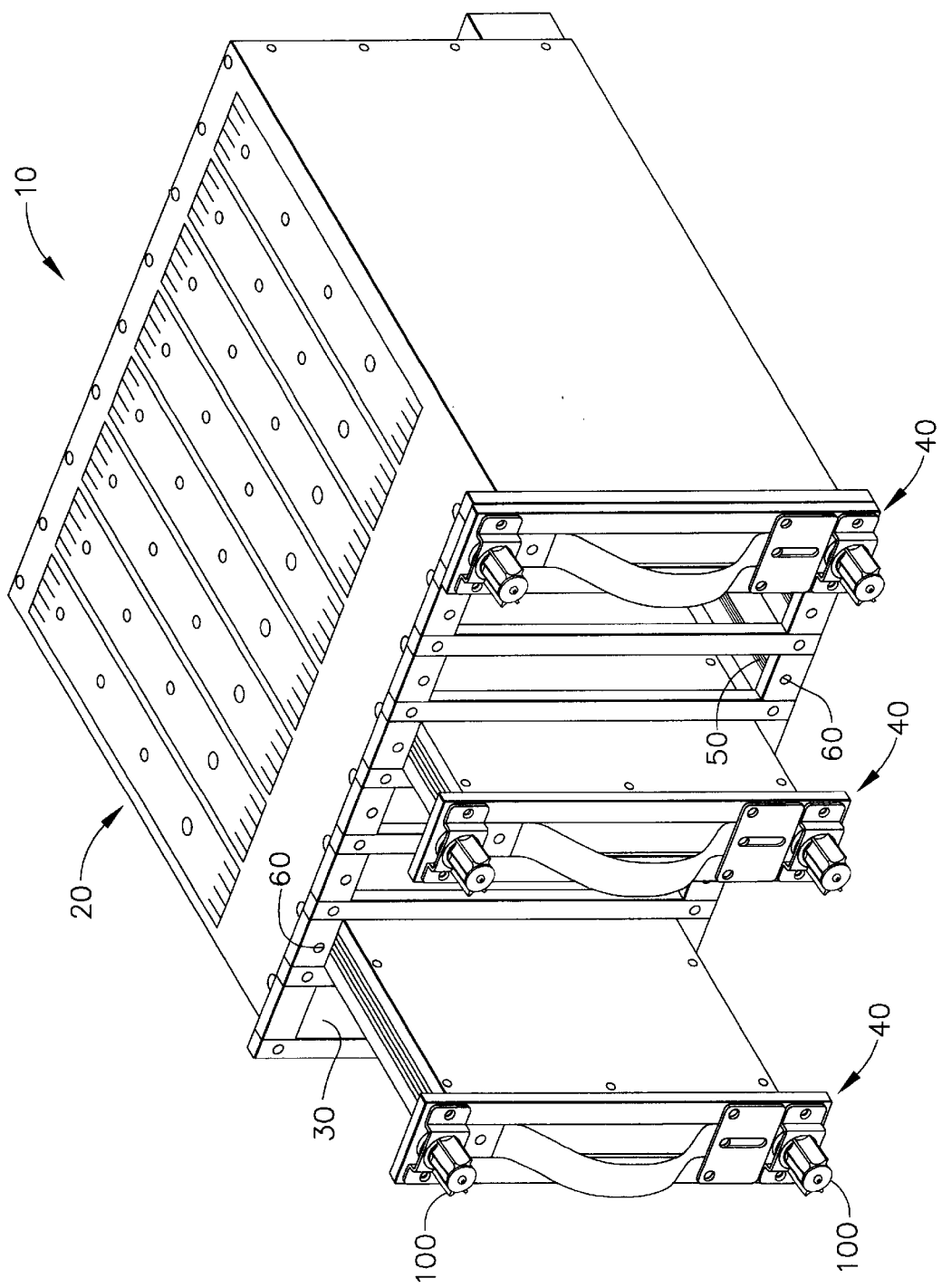
FIG. 1 illustrates a perspective view of an integrated modular avionics (IMA) cabinet housing printed circuit board (PCB) modules having insertion extraction devices (IEDs) according to the present invention.

FIG. 1 illustrates a perspective view of an integrated modular avionics (IMA) cabinet 10 housing printed circuit board (PCB) modules 40 having insertion extraction devices (IEDs) 100 according to the present invention. IMA cabinet 10 includes a chassis 20 suitable for housing a PCB module in each of eight slots such as a first slot 30. Each slot includes a corresponding guide rail 50. Shown in FIG. 1 is a representative set of three PCB modules 40. Each PCB module 40 includes electrical connectors at a back end thereof (not shown) for coupling to corresponding connectors at the interior side of the back end of chassis 20. Each PCB module 40 also includes two IEDs 100 located at top and bottom sides of a front panel portion. Alternatively a single IED would be sufficient for proper engagement and extraction. Chassis 20 also includes two threaded holes 60 for each slot 30 corresponding to the positions of IEDs 100 on each PCB module 40.

Figure 2:
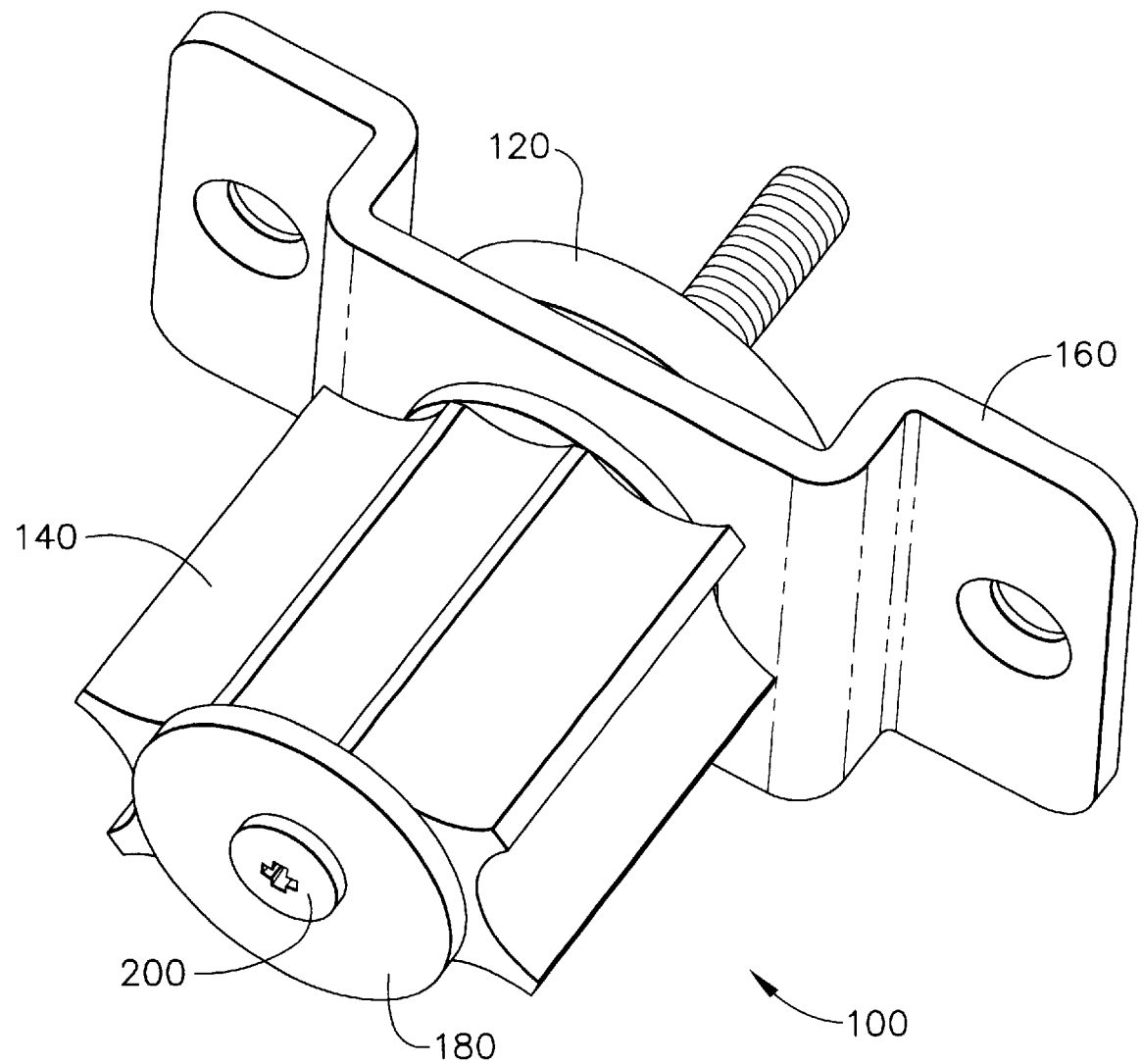
FIG. 2 illustrates a perspective view of an IED of FIG. 1.

FIG. 2 illustrates a perspective view of an IED 100 of FIG. 1. IED 100 includes generally a mandrel 120, a flexible sleeve 140, a retaining plate 160, a captivating washer 180, and a retaining screw 200. Retaining plate 160 attaches IED 100 to the front plate of a PCB module 40 through holes at both ends. Screw 200 secures flexible sleeve 140 and washer 180 to mandrel 120, leaving flexible sleeve 140 free to rotate.

Now considering FIGS. 1 and 2 together, in order to insert PCB module 40 into chassis 20, an operator slides PCB module 40 into a slot 30 along guide rail 50 until the end of mandrel 120 contacts a corresponding threaded hole 60. At this time the electrical connectors on PCB module 40 and chassis 20 are in close proximity but have not yet engaged. The operator then turns flexible sleeve 140 in a clockwise direction. Flexible sleeve 140 is adapted to turn mandrel 120 with no more than a limited amount of torque, thereby limiting the force by which the electrical connectors of PCB module 40 engage the corresponding connectors at the interior side of the back end of chassis 20. By the time the front plate of PCB module 40 contacts the front of chassis 20, PCB module 40 has moved inward along slot 50 deeply enough to have made sufficient electrical contact with the electrical connectors in chassis 20.

Figure 3:
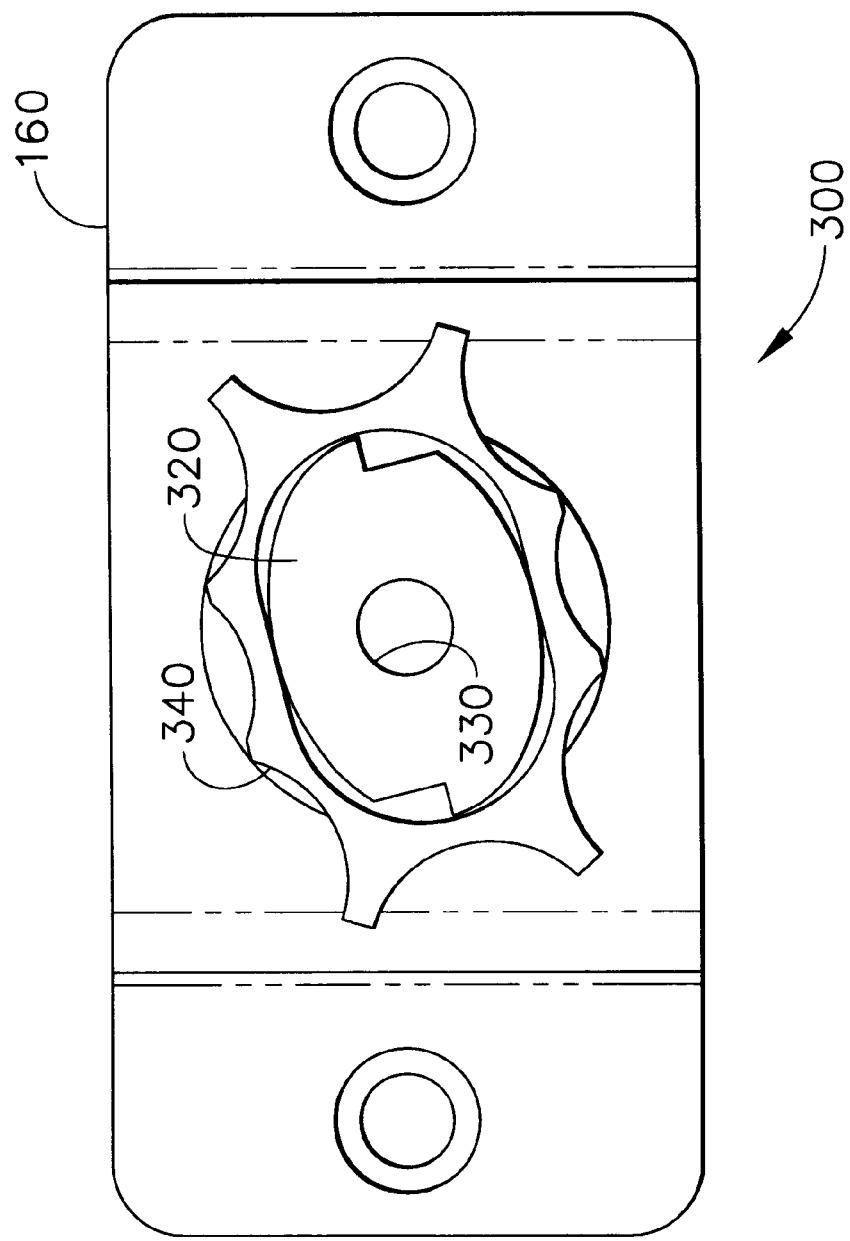
FIG. 3 illustrates a cut-away view of the IED of FIG. 2.

The operation of IED 100 can be better understood from FIG. 3, which illustrates a cut-away view 300 of IED 100 of FIG. 2. Shown in FIG. 3 is a mandrel portion 320 of mandrel 120, a sleeve portion 340 of flexible sleeve 140, and retaining plate 160. Mandrel portion 320 is elliptical in shape and has two discontinuities located at ends of the major diameter thereof. These discontinuities form a step along the perimeter in the counter-clockwise direction. Located in a center of mandrel portion 320 is a threaded hole 330 suitable for coupling to screw 200. Sleeve portion 340 has a smooth inner perimeter that distorts to assume an elliptical shape similar to the elliptical shape of mandrel portion 320. Sleeve portion 340 has an outer perimeter with a set of ribs (or flutes) that enhance its gripability.

The operation of IED 100 can be understood by considering FIGS. 1–3 together. An Ad operator turns sleeve 140 in a clockwise direction to insert PCB module 40 into the corresponding slot of chassis 20, and in a counterclockwise direction to extract PCB module 40 from the corresponding slot of chassis 20. Mandrel 120 will rotate to insert PCB module 40 into a corresponding slot 60 when an operator imparts a moderate amount of torque on sleeve 140 in the clockwise direction. However once the torque exceeds a predetermined amount, sleeve 140 slips freely (cams) over the outer perimeter of mandrel 120. Thus IED 100 ensures that PCB module 40 is inserted into the slot with no more than a predetermined maximum amount of force. A designer can select this predetermined maximum amount by varying the size and shape of mandrel 120 and the elasticity of the material forming sleeve 140, and can estimate it using commercially available computer aided design (CAD) modeling packages.

When the operator turns sleeve 140 in the counterclockwise direction, flexible sleeve 140 will distort to grip the steps of mandrel 120, allowing the operator to impart a large amount of torque to mandrel 120. This feature is advantageous because the extraction force from the chassis is not critical.

IED 100 has numerous advantages over conventional devices constructed of coil springs, spherical balls, detente plates, spring washers, drive clutches, disc springs, and the like. IED 100 minimizes the quantity of moving parts. It may be calibrated when flexible sleeve 140 is fabricated, and will never require calibration after assembly. "Recalibration" can be achieved by simply replacing the existing sleeve with a substitute sleeve calibrated to another desired maximum amount of torque. In addition to being suitable for new designs, IED 100 may also be substituted for an existing clutch configuration. Mandrel 120 can be fabricated from a hard material such as metal. It can be die-cast around a threaded post, and a tapped hole can be later installed. Mandrel 120 can also be notched in the opposite direction, gripping in the clockwise direction and slipping in the counter-clockwise direction. Flexible sleeve 140 is durable yet flexible and is easily replaced if damaged. It can be easily manufactured by extruding it and cutting it to length as needed. Flexible sleeve 140 may be fabricated from materials such as nylon or urethane plastic, which are capable of many flexures yet are durable enough not to flake, chip or permanently dent in any appreciable amount when the sleeve rotates around the mandrel or grips the notch. Flexible sleeve 140 may also be conveniently modeled using modern computer aided design (CAD) techniques, allowing the designer to calibrate IED 100 using the properties of the flexible material and a three-dimensional modeling system.

FIGS. 4–8 describe further details and properties of the components of IED 100. FIG. 4 illustrates a side view of mandrel 120 of FIG. 2. Mandrel 120 has a circular base 122 near the center having a length 130 along a horizontal axis of 0.130 inches and a diameter 131 of 0.775 inches. Adjacent to a right surface of base 122 is a thin circular portion 124 having a length 132 of 0.05 inches and a diameter 133 of 0.576 inches. On the right side of base 122 to the right of thin circular portion 124 and along the honzontal axis is a first section 126 having a length 134 of 0.82 inches, a major diameter of 0.576 inches, and a minor diameter of 0.404 inches. On the left side of base 122 along the horizontal axis from a left surface of base 122 is a second section 128 having a length 135 of 0.75 inches and a diameter 136 of 0.164 inches. Second section 128 is threaded post for mating with a corresponding threaded hole 60 of chassis 20. It should be apparent that in other embodiments other. suitable attachments adapted to couple to a corresponding member on chassis 20 may be used. For example second section 128 may be a threaded hole which engages a corresponding threaded post on chassis 20.

Mandrel 120 is constructed of a relatively-hard material such as metal. It is preferably die-cast around a threaded post with a tapped hole subsequently installed and thus is inexpensive to manufacture.

FIG. 5 illustrates top view of mandrel 120 of FIG. 2, as viewed from the end of first section 126. A threaded hole 500 extends inward from the surface of mandrel 120. The cross-sectional shape of first section 126 is characterized by a major diameter 502 and a minor diameter 504. The relative sizes of major diameter 502 and minor diameter 504 in part determine the maximum amount of torque by which an operator can turn mandrel 120 before the flexible sleeve slips. Major diameter 502 has a size 510 equal to 0.576 inches. Minor diameter 504 has a size 512 equal to 0.404 inches. In the illustrated embodiment the shape of first section 126 is elliptical. However other suitable shapes including oval, rectangular with rounded edges, and the like may be substituted for the illustrated oval shape. Section 126 is not perfectly elliptical and includes two steps 506 and 508 at each end of major diameter 502. Each of these steps is 0.05 inches in size. When the operator turns IED 100 in the counterclockwise direction, the inside surface of flexible sleeve 140 will catch the steps, allowing a large amount of torque to be applied. In other embodiments in which the maximum extraction force must similarly be limited, steps 506 and 508 may be eliminated. Furthermore only one of steps 506 and 508 is required to allow a large amount of torque in the counterclockwise direction. Also the direction of the step could be reversed to allow a maximum amount of torque in the counterclockwise direction but a large amount of torque in the clockwise direction.

Figure 6:
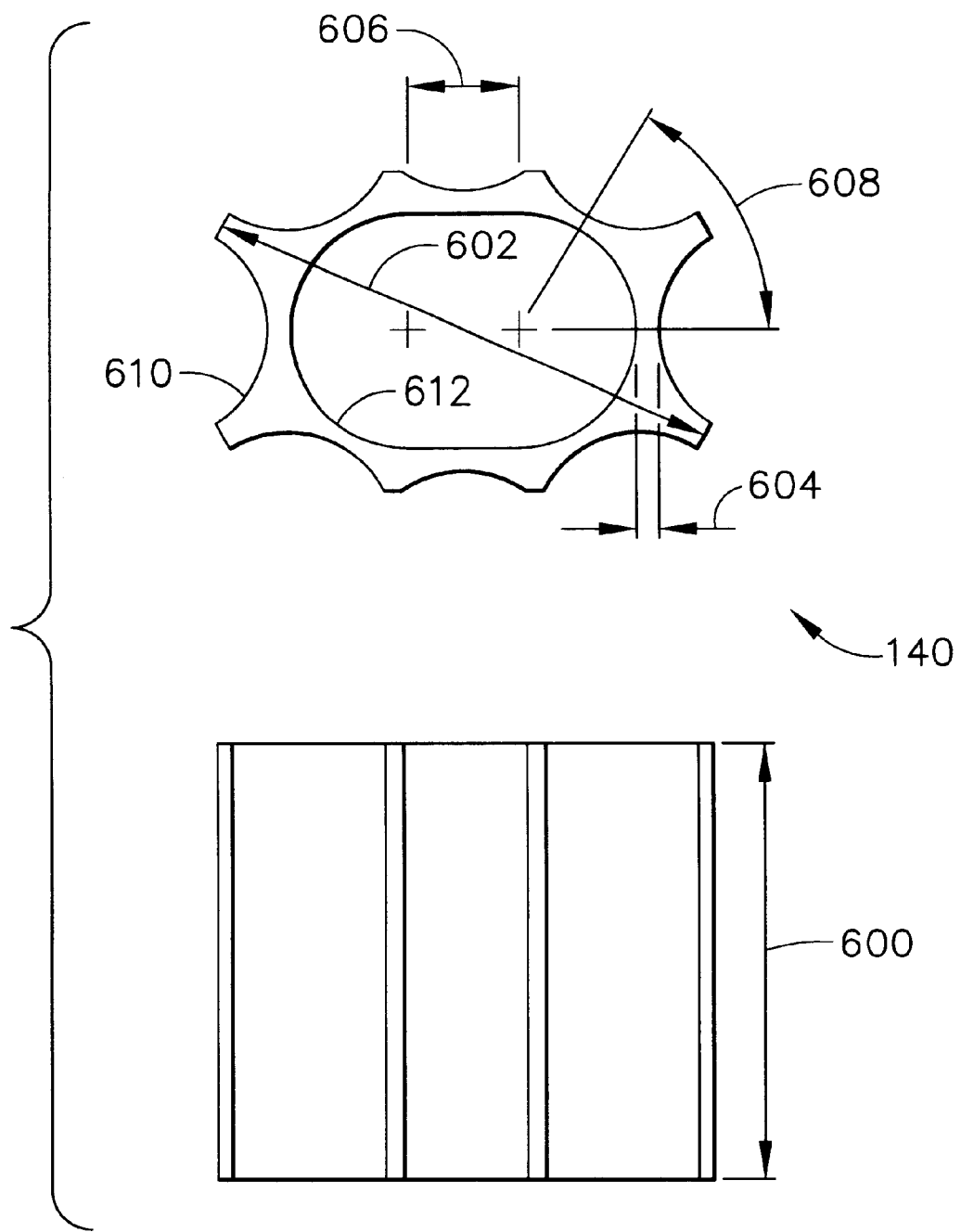
FIG. 6 illustrates a top view of the flexible sleeve of FIG. 2.

FIG. 6 illustrates top and side views of flexible sleeve 140 of FIG. 2. Preferably, flexible sleeve 140 is fabricated with black nylon and has a height 600 of 0.75 inches. Viewed from a top thereof, flexible sleeve 140 assumes the approximate elliptical shape of the first section of mandrel 120. Such an ellipse has a length 606 between the two foci defining the ellipse of 0.190 inches. Flexible sleeve 140 is smooth along an inner perimeter thereof, and has eight ribs positioned evenly around the outer perimeter thereof. The area between adjacent ribs forms eight flutes. The distance 604 between the deepest position of the cavity of a flute and the inner perimeter is equal to 0.025 inches. When flexible sleeve 140 rotates such that the deepest part of a flute is aligned with the end of the ellipse, an angle 608 equal to sixty degrees is formed between the deepest part of this flute and the deepest part of an adjacent flute. A flute has a radius 610 equal to 0.172 inches, whereas the end of the ellipse has a radius 612 of 0.202 inches.

Figure 7:
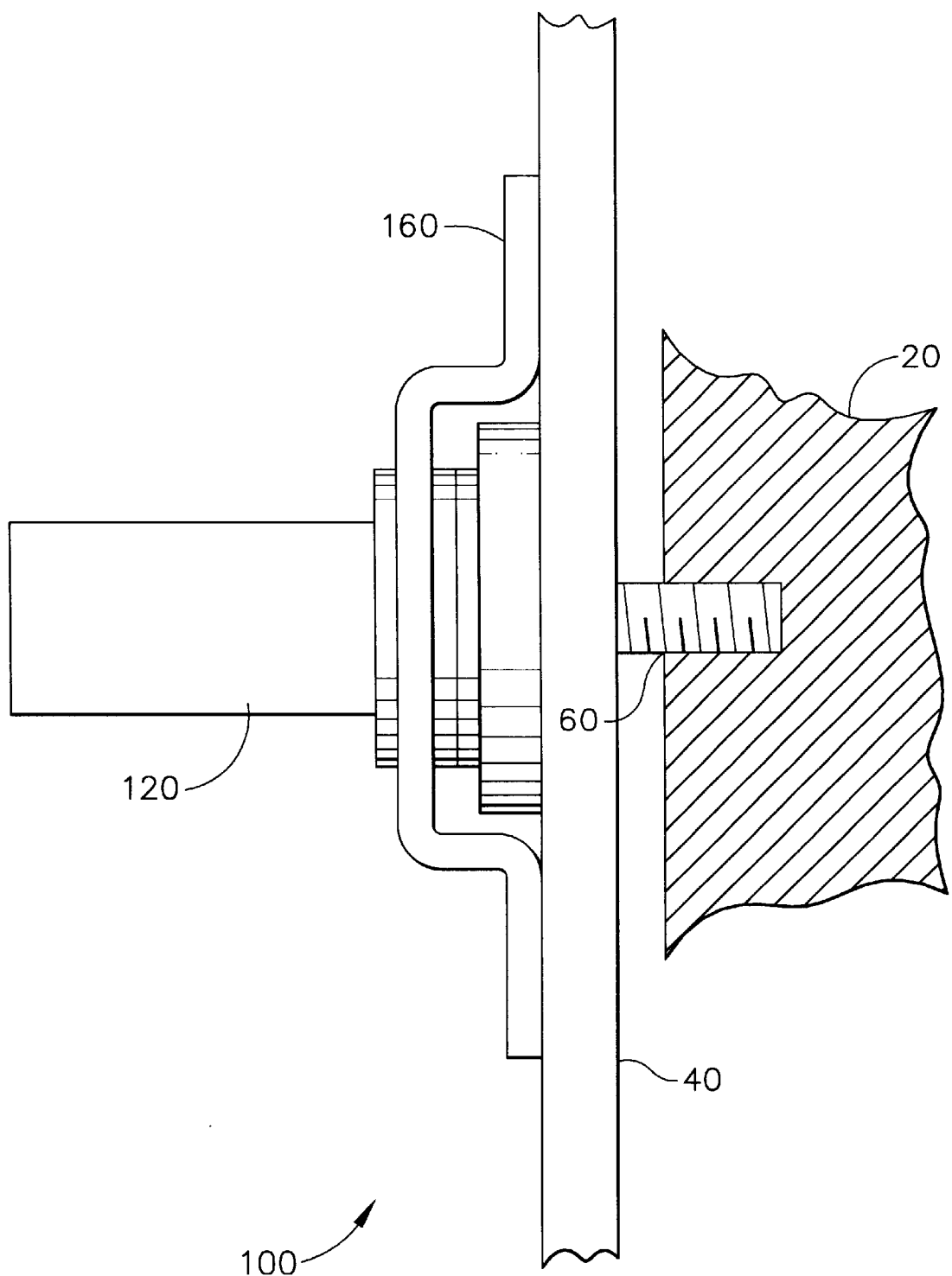
FIG. 7 illustrates a side view of the insertion extraction device of FIG. 1 in which a retaining plate is used to captivate the mandrel to the printed circuit board module.
Figure 8:
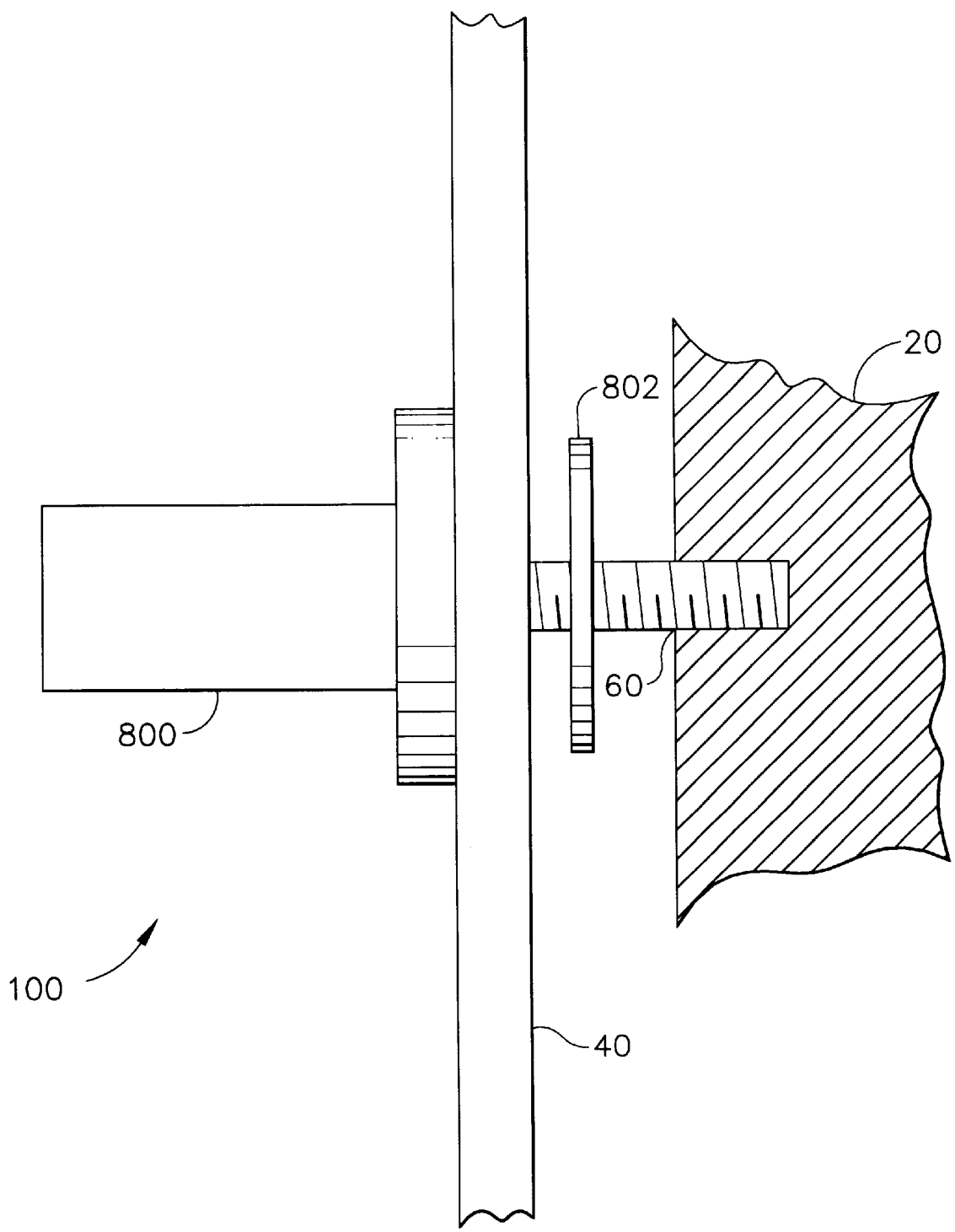
FIG. 8 illustrates a side view of the insertion extraction device of FIG. 1 in which a keeper member is used to captivate the mandrel to the printed circuit board module.

FIGS. 7 and 8 illustrate two different methods of attaching IED 100 to PCB module 40. FIG. 7 illustrates a side view of a portion of IED 100 of FIG. 1 (without flexible sleeve 140 and retaining hardware) in which retaining plate 160 is used to captivate mandrel 120 to PCB module 40. In this embodiment thin circular section 124 fits within a central hole of retaining plate 160. The central hole has a diameter of 0.609 inches which provides enough clearance to allow mandrel 120 to rotate freely. FIG. 8 illustrates a side view of a portion of IED 100 of FIG. 1 (without flexible sleeve 140 and retaining hardware) in which a keeper member 802 is used to captivate a mandrel 800 to PCB module 40. As shown in FIG. 8 mandrel 800 is made without a thin circular portion. Keeper member 802 may be formed by an E-ring or snap-ring keeper or the like.

While the invention has been described in the context of a preferred embodiment, various modifications will be apparent to those skilled in the art. For example an IED according to the present invention can be used advantageously in any system which requires insertion and/or extraction subject to a maximum force. Thus it may be used in non-electrical systems. While such an IED is particularly useful in avionics and other airline systems, it may also be used in applications such as test equipment. Also flexible sleeve 140 may be constructed using any of a variety of materials with sufficient flexibility and strength, including nylon, urethane plastic, and the like. It may be uniform so to allow it to be extruded and cut to the appropriate length, or non-uniform. Also the mandrel can assume a variety of shapes such as elliptical, oval, rectangular with rounded corners, and the like. A threaded hole could be substituted for the threaded post of the mandrel. Accordingly, it is intended by the appended claims to cover all modifications of the invention which fall within the true scope of the invention.

I claim:

1. An insertion extraction device for attaching a printed circuit board (PCB) module to a cabinet, comprising:
   a mandrel having a first section on a first side thereof with a cross section characterized by a major diameter and a smaller minor diameter, and a second section on a second side thereof adapted to couple to a corresponding member on the cabinet;
   a retaining plate for affixing said mandrel to the PCB module; and
   a flexible sleeve positioned over said first section of said mandrel, said flexible sleeve having a predetermined elasticity such that when said flexible sleeve is rotated in a first direction with a torque less than a predetermined amount, said sleeve distorts to engage and turn said mandrel, and when said sleeve is rotated in said first direction with a torque greater than said predetermined amount of torque; said sleeve slips over said first section of said mandrel, thereby limiting the maximum amount of force applied for the insertion of the PCB module to the cabinet.

2. The insertion extraction device of claim 1 wherein the cabinet comprises an integrated modular avionics cabinet.

3. The insertion extraction device of claim 1 wherein the cabinet comprises a consumer entertainment system for an airplane.

4. The insertion extraction device of claim 1 wherein said first section of said mandrel is characterized as being elliptical.

5. The insertion extraction device of claim 1 wherein said flexible sleeve comprises nylon.

6. The insertion extraction device of claim 1 wherein said flexible sleeve comprises urethane plastic.

7. The insertion extraction device of claim 1 wherein said flexible sleeve has an outer perimeter comprising a plurality of ribs.

8. The insertion extraction device of claim 1 wherein said cross section of said first section of said mandrel comprises a step located at a first end of said major diameter thereof, wherein said step causes a discontinuity along a perimeter of said first section of said mandrel in said first direction.

9. The insertion extraction device of claim 1 wherein said cross section of said first section of said mandrel further comprises a step located at a second end of said major diameter thereof.

10. The insertion extraction device of claim 1 wherein said mandrel comprises a threaded hole at an end thereof disposed opposite the cabinet, said insertion extraction device further comprising a washer and a retaining screw extending through said washer into said threaded hole.

11. An insertion extraction device for attaching a movable component to a fixed structure, comprising:
   a mandrel affixed to the movable component and having a first section on a first side thereof with a cross section characterized by a major diameter and a smaller minor diameter, and a second section on a second side thereof adapted to couple to a corresponding member on the fixed structure; and
   a flexible sleeve positioned over said first section of said mandrel, said flexible sleeve having a predetermined elasticity such that when said flexible sleeve is rotated in a first rotation direction with a torque less than a predetermined amount, said flexible sleeve distorts to engage and turn said mandrel, and when said flexible sleeve is rotated in said first rotation direction with a torque greater than said predetermined amount, said flexible sleeve slips over said first section of said mandrel, thereby limiting the maximum amount of force applied for the insertion of the movable component into the fixed structure.

12. The insertion extraction device of claim 11 further comprising a retaining plate for affixing said mandrel to the movable component.

13. The insertion extraction device of claim 11 further comprising a keeper member for affixing said mandrel to the movable component.

14. The insertion extraction device of claim 11 wherein said flexible sleeve comprises nylon.

15. The insertion extraction device of claim 11 wherein said flexible sleeve comprises urethane plastic.

16. The insertion extraction device of claim 11 wherein said flexible sleeve has an outer perimeter comprising a plurality of ribs.

17. The insertion extraction device of claim 11 wherein said first section of said mandrel comprises a step located at a first end of said major diameter thereof, wherein said step causes a discontinuity along a perimeter of said first section of said mandrel in a second rotation direction.

18. An insertion extraction device for attaching a movable component to a fixed structure, comprising:
   a mandrel having a base, a first section, and a second section, said first section extending from a first side of said base along a first axis perpendicular to said base, said first section having a cross section characterized as having a major diameter and a minor diameter, wherein said major diameter is larger than said minor diameter, said second section rigidly attached to a second side of said base and extending from said second side of said base along said first axis, said second section adapted to couple to a corresponding member on the fixed structure; and
   a flexible sleeve having a predetermined internal diameter and positioned over said first section of said mandrel, said flexible sleeve having a predetermined elasticity such that when said flexible sleeve is rotated in a first direction with a torque less than a predetermined amount, said sleeve distorts to engage and turn said mandrel, and when said sleeve is rotated in said first direction with a torque greater than said predetermined amount of torque, said sleeve slips over said first section of said mandrel, thereby limiting the maximum amount of force applied for the insertion of the movable component to the fixed structure.

19. The insertion extraction device of claim 18 wherein said cross section of said first section of said mandrel further comprises a step located at a second end of said major diameter thereof.

20. The insertion extraction device of claim 9 wherein said cross section of said first section of said mandrel further comprises a step located at a second end of said major diameter thereof.

* * * * *